United States Patent [19]

Tielert

[11] 4,305,201

[45] Dec. 15, 1981

[54] PROCESS FOR THE PRODUCTION OF A MIS FIELD EFFECT TRANSISTOR HAVING AN ADJUSTABLE, EXTREMELY SHORT CHANNEL LENGTH

[75] Inventor: Reinhard Tielert, Munich, Fed. Rep. of Germany

[73] Assignee: Siemens Aktiengesellschaft, Berlin & Munich, Fed. Rep. of Germany

[21] Appl. No.: 133,928

[22] Filed: Mar. 25, 1980

[30] Foreign Application Priority Data

Mar. 29, 1979 [DE] Fed. Rep. of Germany ....... 2912535

[51] Int. Cl.³ ............................................. H01L 29/78
[52] U.S. Cl. .................................... 29/571; 29/576 B; 148/1.5
[58] Field of Search ..................... 148/1.5; 357/23, 91; 29/571, 576 B

[56] References Cited

U.S. PATENT DOCUMENTS 4,045,251 8/1977 Graul et al. .......................... 148/1.5
4,173,818 11/1979 Bassous et al. ........................ 29/571
4,190,850 2/1980 Tihanyi et al. ........................ 357/23
4,216,029 6/1980 Ohki ..................................... 148/1.5

Primary Examiner—Donald L. Walton
Attorney, Agent, or Firm—Hill, Van Santen, Steadman, Chiara & Simpson

[57] ABSTRACT

A process is disclosed for the production of a MIS field effect transistor having an adjustable, extremely short channel length. The effective channel length is set by superimposing at least two implantation steps employing differing implantation energy and doses. A gate electrode which possesses vertically etched edges is used as an implantation mask for the source implantation and drain implantation. The process allows a MOS structure having an arbitrarily small effective channel length to be constructed by exploiting the lateral scattering which occurs during the ion implantation without influence by mask tolerances. The process corresponding to the theory of the invention provides the possibility of constructing a DIMOS-similar transistor having typical structural dimensions in the region of 1 μm and less.

7 Claims, 7 Drawing Figures

PROCESS FOR THE PRODUCTION OF A MIS FIELD EFFECT TRANSISTOR HAVING AN ADJUSTABLE, EXTREMELY SHORT CHANNEL LENGTH

BACKGROUND OF THE INVENTION

The Patent Application relates to a process for the production of a MIS (metal-insulator-substrate) field effect transistor having an adjustable, extremely short channel length. An insulating layer is applied to the surface of a semiconductor substrate and a gate electrode layer is applied to this insulating layer. Ion implantation is used to produce in the semiconductor substrate a drain and a source zone of the first conductivity type and a second doped zone of the second conductivity type which surrounds the source zone at least in the direction of the drain zone, and which at the side of the source zone adjoins the substrate surface. The channel zone consists of the intermediate zone of the semiconductor substrate which lies between the outer edge of the second doped zone which adjoins the substrate surface and the adjacent edge of the source zone.

The reduction in size of the structure of MOS devices unintentionally entails an impairment of the electrical properties of the elements, which is manifest, for example, in a shift of the threshold voltage, the punch-through of the drain voltage, and possibly also an increase of the body effect.

The reduction in structure size also results in a greater influence of the tolerances in the geometric structure production and transfer. A reduction in tolerances can only be achieved with increased apparatus expense. In order to avoid this, alternative self-adjusting processes must be found.

A process of the type described in the introduction is disclosed in the German OS No. 27 03 877 corresponding to U.S. application Ser. No. 870,216 now U.S. Pat. No. 4,190,850 (DIMOS transistor), incorporated herein by reference, in which the effective channel length is adjusted by bevelling the edge of the gate electrode which is composed of polycrystalline silicon. The wedge-shaped path of the gate electrode layer over the channel zone facilitates a "self-adjusting" production of the source zone and of the second doped zone by which it is surrounded, since the gate electrode layer is used as an implantation mask. The energy used for the implantation of the second doped zone is such that, in accordance with the increase in thickness of the gate electrode layer the implanted ions penetrate less deeply into the semiconductor substrate, and in this way the concentration maximum of the ions implanted to form the second doped zone passes through the surface of the semiconductor substrate at a short distance from the edge of the source zone. The distance between this through line and the edge of the source zone can be determined via the magnitude of the wedge angle. This distance constitutes the length of the channel used for the MIS field effect transistor. Increasing reduction in the geometry of the components means that high demands must be made on the reproducibility of the mask edge and on the homogeneity of the gate material. Furthermore it is difficult to use this (DIMOS) process in combination with metal gates.

SUMMARY OF THE INVENTION

Therefore an object of the invention is to produce a MOS structure having an arbitrarily small, effective channel length, wherein the effective channel length is not influenced by mask tolerances.

This object is realized in the production of the dopant profile for the effective channel zone and the source zone, by deliberately exploiting the lateral scattering which occurs during the ion implantation. The implantation mask for the source and drain implantation consists of at least one layer which is arranged on the semiconductor substrate which is impermeable to the oncoming ions, and is provided with vertical etching edges, and that the effective channel length is set by superimposing at least two implantations of dopant particles of the second conductivity type with differing implantation energy and doses.

It lies within the scope of the invention to use the gate electrode which is arranged on the semiconductor substrate and has vertically etched edges as an implantation mask for the source and drain implantation, and to use the $SiO_2$ thick oxide layer as an implantation mask for the lateral delimitation. The process is independent of the gate and mask material. Polysilicon structures or metal gates (in particular with photo-resist layers or $SiO_2$ layers arranged thereupon) can be used for example as the mask.

In a further development of the principle of the invention it is provided that two implantation steps be carried out consecutively in order to produce a variable doping of the channel zone, wherein, in an arbitrary sequence, a high energy implantation in the region of 50 keV and a low energy implantation in the region of 50 keV are carried out. These implantation steps can be carried out through oxide which is present on the substrate material. In this case the oxide has the favorable effect of a "stray oxide." The process can also be used without oxide or with partially removed oxide.

The activation of the ions and the annealing of the radiation damage can be limited to a minimum period of time. The heat treatment has a relatively small influence on the doping profile. In accordance with an exemplary embodiment corresponding to the theory of the invention, heat treatment at 1000° C. for a period of 10 min. is adequate.

The process is used in particular for the production of a MOS field effect transistor in the n-channel technique, as in this case the mobility of the charge carriers in the channel zone is greater than in the p-channel technique, resulting in a greater transconductance.

Further details will be described in the form of an exemplary embodiment relating to the production of a n-channel-MOS field effect transistor and FIGS. 1 to 7.

DESCRIPTION OF THE PREFERRED EMBODIMENTS

Figure 1:
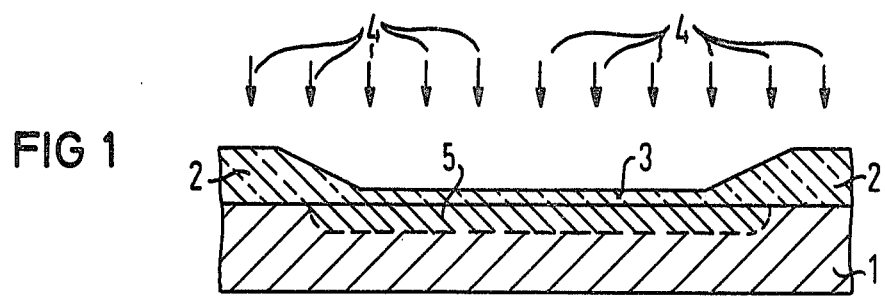
FIGS. 1 to 4 schematically illustrate by cross-sectional views the production process of the invention for the semiconductor device.

As illustrated in FIG. 1, on a weakly p-conducting silicon substrate 1 there is produced in known manner an oxide layer 2 and 3 which is provided by means of a photolithographic process, with a typical thickness of 0.02 to 0.05 μm in those zones (3) in which the MOS transistor is to be produced. The differing oxide thicknesses at locations 2 and 3 are produced by local oxidation. However, it is also possible to use other processes corresponding to the prior art; thus for example etching in location or zone 3. Phosphorus ions 4 are implanted through the thin layer 3 in order to produce a weakly n-conducting zone 5 in the substrate 1. Here the thick oxide zones 2 serve as a mask.

Figure 2:
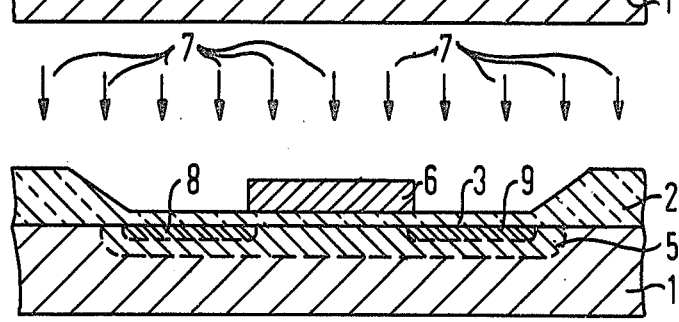

Then, as illustrated in FIG. 2, a layer of polycrystalline silicon is deposited and, by means of a photolithographic process followed by etching, is structured in such manner as to form the gate electrode 6 having vertically etched edges. This is expediently effected by reactive ion etching. The gate electrode 6 now serves as an implantation mask for the following source 8 implantation and drain 9 implantation. Here arsenic ions 7 are used with an energy of approximately 100 keV and a dose of approximately $3 \times 10^{15} cm^{-2}$.

Figure 3:
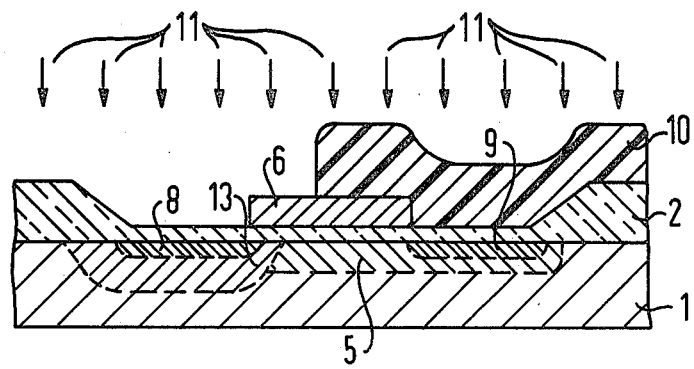

Then, as illustrated in FIG. 3, the channel zone 13 is produced in that the drain zones 9 are covered with a photoresist layer 10 and boron ions 11 are implanted through the exposed source zones 8. Two implantation steps are carried out consecutively with the following parameters. First implantation step: implantation energy 80 keV and implantation dose $5 \times 10^{11} cm^{-2}$. Second implantation step: implantation energy 25 keV and implantation dose $1 \times 10^{14} cm^{-2}$.

The low energy boron implantation fundamentally influences the start voltage, whereas the high energy implantation influences the punch-through strength.

Following the removal of the photo-resist layer 10, the arrangement is tempered for 15 minutes at 1000° C. in order to electrically activate the ions and anneal the radiation damage.

Figure 4:
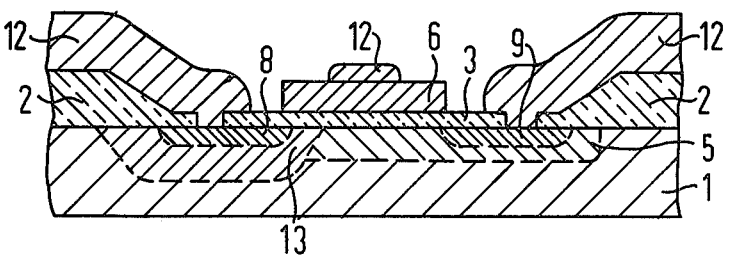

Then, as shown in FIG. 4, a photolithographic process is used to apply the metallization which serves to produce the electric terminals 12. All the other references are the same as used in FIGS. 1 to 3.

Figure 5:
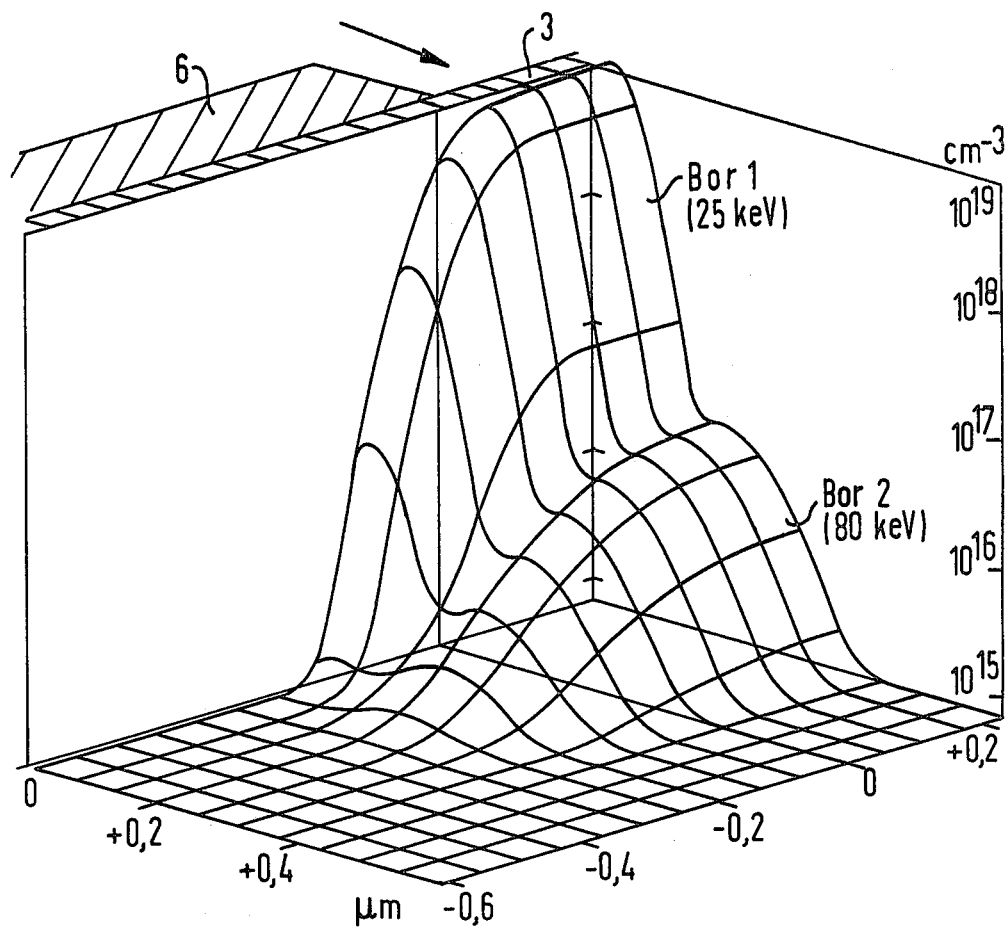
FIGS. 5 to 7 illustrate by 3-dimensional graphs the simulation of the process described in the invention with a numerical model.
Figure 6:
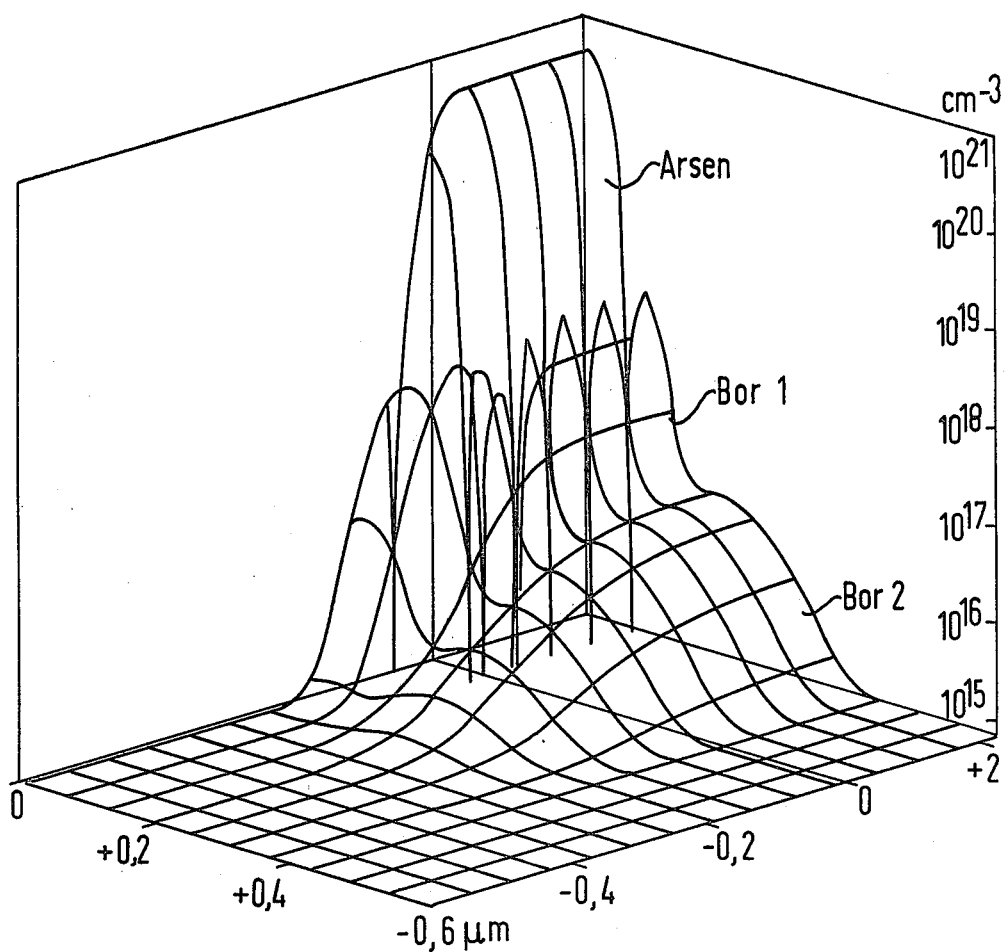
Figure 7:
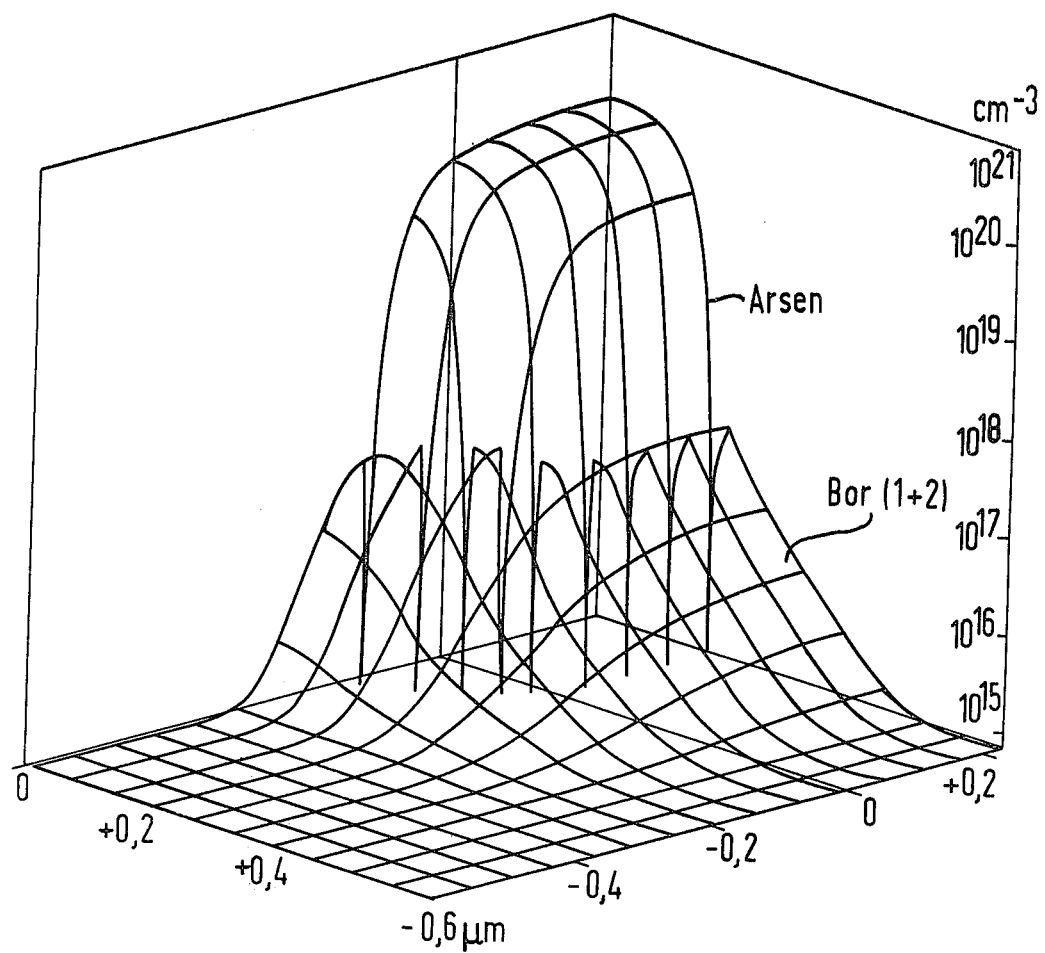

As a result of the two-dimensional simulation, FIGS. 5 to 7 illustrate the doping profile in the source zone of a corresponding MOS transistor following the described implantation steps. The parameters for the boron 1 and boron 2 implantation steps and for the source doping (arsenic implantation) have been selected to correspond to those above. In order to optimize the component for a specific purpose of use, it may be necessary to select different data; merely the principle is to be clearly disclosed here. The plane which has been arranged as a network represents a cross-section through the semiconductor substrate. The observer is looking from the interior of the semiconductor to the surface. The mask edge runs at the location (0,0). The plane which lies in the foreground in front of the zero lines represents that region which is "shaded" by the gate and into which the ions are scattered.

FIG. 5 illustrates the first channel implantation step (boron 1) and the second channel implantation step (boron 2). The gate electrode 6 which serves as mask and the oxide 3 are provided in the left-hand region. The arrows indicate the direction of the implantation.

In addition to the boron 1 and boron 2 implantation steps, FIG. 6 illustrates the source implantation (arsenic), and FIG. 7 shows the doping profile following the tempering process (1000° C., 15 minutes).

The process corresponding to the theory of the invention facilitates the production of a DIMOS-type transistor having typical structure dimensions in the region of 1 $\mu$m and less.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A process for the production of a metal-insulator-substrate MIS field effect transistor having an adjustable, extremely short channel length, comprising the steps of:

providing a semiconductor substrate of first conductivity type;

applying an insulating layer to a surface of the substrate, said insulating layer also serving as an implantation mask for implantation of a source and a drain zone, the insulating layer having at least one portion which is thicker than other portions of the layer and is impermeable to oncoming ions, the thicker portion having an etched edge;

producing by ion implantation through thinner portions of the insulating layer a doped zone of second conductivity type;

applying a gate electrode layer having substantially vertical edges on the thinner portions of the insulating layer;

producing by ion implantation the source and drain zones of first conductivity type between the gate electrode and thicker portions of the insulating layer such that the source and drain zones are surrounded by the doped zone of second conductivity type at least in a direction of the drain zone and at a side of the source zone adjoining the substrate surface; and forming a channel zone of a given effective channel length by superimposing at least two implantation steps using dopant particles of second conductivity type with differing implantation energy and doses which set the effective channel length, said two implantation steps being applied by masking the drain zone and doping between the thicker portion of the insulating layer and the vertical edges of the gate electrode through the source zone into a portion of the doped zone of second conductivity type so as to form the effective channel length of the channel zone between the source zone and remaining portions of the doped zone of second conductivity type.

2. A process of claim 1 wherein the two implantation steps are consecutive lower and higher energy implantations with the lower energy implantation influencing start voltage of the device and the higher energy implantation influencing punch-through strength of the device.

3. A process of claim 1 including the step of producing the vertically etched edges of the gate electrode by reactive ion etching.

4. A process of claim 1 including the step of providing a structured polysilicon layer as the gate electrode.

5. A process of claim 1 including the steps of providing the channel zone by the two implantation steps in arbitrary sequence, namely a high energy implantation step greater than approximately 50 keV and a low energy implantation step less than approximately 50 keV.

6. A process of claim 1 wherein following the last implantation step a tempering process is carried out to activate implanted ions and anneal radiation damage.

7. A process of claim 1 including the steps of using arsenic ions for the production of the implanted source and drain zones and boron ions of differing energy and dose for the production of the effective channel zone so as to provide an n-channel field effect transistor.

* * * * *